United States Patent
Lee et al.

(10) Patent No.: US 6,711,009 B2
(45) Date of Patent: Mar. 23, 2004

(54) TOP COVER OF A COMPUTER SYSTEM HOUSING

(75) Inventors: Jen-Hsiang Lee, Taipei (TW); Guo-Ming Huang, Keelung (TW)

(73) Assignee: Quanta Computer Inc., Tao Yuan Shien (TW)

(*) Notice: Subject to any disclaimer, the term of this patent is extended or adjusted under 35 U.S.C. 154(b) by 98 days.

(21) Appl. No.: 10/163,392

(22) Filed: Jun. 5, 2002

(65) Prior Publication Data

US 2003/0227740 A1 Dec. 11, 2003

(51) Int. Cl.[7] ................................................ G06F 1/16
(52) U.S. Cl. ..................... 361/683; 361/681; 361/680; 361/724; 361/727; 312/223.2; 312/244; 292/124; 292/128; 248/551; 248/552; 248/553
(58) Field of Search ........................... 361/680–686, 361/724–727, 739, 752; 312/223.1, 223.2, 223.3, 244; 292/42, 126, 128, 148, 151, 207, DIG. 37, DIG. 38; 174/35 C, 35 R; 220/4.02, 812, 324, 216–218, 323; 348/836; 206/706; 248/551–553; 16/224

(56) References Cited

U.S. PATENT DOCUMENTS

| | | | | |
|---|---|---|---|---|
| 5,121,296 A | * | 6/1992 | Hsu | 361/685 |
| 5,164,886 A | * | 11/1992 | Chang | 361/683 |
| 5,743,606 A | * | 4/1998 | Scholder | 312/223.2 |
| 5,931,550 A | * | 8/1999 | Chen | 312/244 |
| 6,000,767 A | * | 12/1999 | Liu et al. | 312/223.2 |
| 6,373,692 B1 | * | 4/2002 | Cheng | 361/683 |
| 6,556,438 B1 | * | 4/2003 | Bolognia et al. | 361/687 |
| 6,560,114 B2 | * | 5/2003 | Berry et al. | 361/727 |

* cited by examiner

*Primary Examiner*—Michael Datskovsky

(57) ABSTRACT

A server housing, comprising a top cover and a base frame, is provided. The top cover has a top piece and parallel first side and second side. The two parallel sides are coupled with two opposite sides of the top piece. Each of the top piece and the two parallel sides has an interior. The top cover further comprises: two approximately parallel latches, five approximately parallel tabs, two first prominences and two second prominences. The two approximately parallel latches are on the interior of the top piece. The five approximately parallel tabs are on the interior of the top piece. The two first prominences are on the interior of the first side. The two second prominences are on the interior of the second side. The base frame is assembled with the top cover and comprises: a first side panel, a second side panel and a mounting bracket. The first side panel comprises two first guiding recesses for receiving the first prominences. The second side panel is parallel to the first side panel. The first side panel comprises two first guiding recesses for receiving the first prominences. The second side panel comprises two second guiding recesses for receiving the second prominences. The mounting bracket comprises five recesses for receiving the tabs; and two notches for receiving the latches.

20 Claims, 6 Drawing Sheets

TOP COVER OF A COMPUTER SYSTEM HOUSING

BACKGROUND OF THE INVENTION

1. Field of the Invention

The invention relates in general to a top cover of a computer system housing, and more particularly to a top cover, which needs no screw in assembling with the base frame.

2. Description of the Related Art

Conventional designs of computer system housings provide a product that it is difficult to efficiently and quickly open, and that requires the manufacturer or the operator to unfasten and then reinstall the screws in the computer case using numerous hand tools. As a service technician would work on many different configurations of computer cases in a single day, the service technician was equipped with the numerous hand tools required to remove the different types of threaded fasteners in order to open and close a computer case and to fix the equipment. Today, it has been more common for an operator to be required to open and close a computer case. Since an operator opens a computer case only occasionally, it is much more unlikely that the operator will possess the correct hand tools necessary to remove and reinstall the threaded fasteners to accomplish this task.

It is therefore desirable to design a computer housing to permit a user or a technician to easily install a top cover into the housing and easily remove the top cover therefrom.

SUMMARY OF THE INVENTION

It is therefore an object of the invention to provide a server housing, comprising a top cover and a base frame. The top cover has a top piece and parallel first side and second side. The two parallel sides are coupled with two opposite sides of the top piece. Each of the top piece and the two parallel sides has an interior. The top cover further comprises: two approximately parallel latches, five approximately parallel tabs, two first prominences and two second prominences. The two approximately parallel latches are on the interior of the top piece. The five approximately parallel tabs are on the interior of the top piece. The two first prominences are on the interior of the first side. The two second prominences are on the interior of the second side. The base frame is assembled with the top cover 100 and comprises: a first side panel, a second side panel and a mounting bracket. The first side panel comprises two first guiding recesses for receiving the first prominences. The second side panel is parallel to the first side panel. The first side panel comprises two first guiding recesses for receiving the first prominences. The second side panel comprises two second guiding recesses for receiving the second prominences. The mounting bracket comprises five recesses for receiving the tabs; and two notches for receiving the latches.

According to a preferred embodiment of the invention, the top cover comprises a front end and a rear end. The tabs are flat pieces which project from the interior of the top piece of the top cover downwardly and then extend toward the front end of the top cover. The latches are controlled by springs. Each of the latches is compressed, while the top cover is moved from the rear end to the front end to assemble with the base frame and each of the latches springs outward and engages in each associated notch while the top cover assembles with the base frame. A plurality of openings are defined on the top cover to expose each of the latches and the assembled and locked top cover and the base frame can be unlocked by pushing the latches away from the notches through the openings.

According to a further preferred embodiment of the invention, the first and second guiding recesses are L-shaped which extend toward the front end of the base frame, viewing from the inside of the base frame. Each of the first and second guiding recesses comprises a vertical cut and a horizon cut. An exterior of each side of the top cover comprises a first positioning mark, and an exterior of the first side panel of the base frame comprises a second positioning mark and a third positioning mark. The first positioning mark aligns with the second positioning mark, while the first and second prominences are inserted into the vertical cuts of the first guiding recesses. The first positioning mark aligns with the third positioning mark while the first and second prominences reach the end of the horizon cuts of the first or second guiding recesses.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
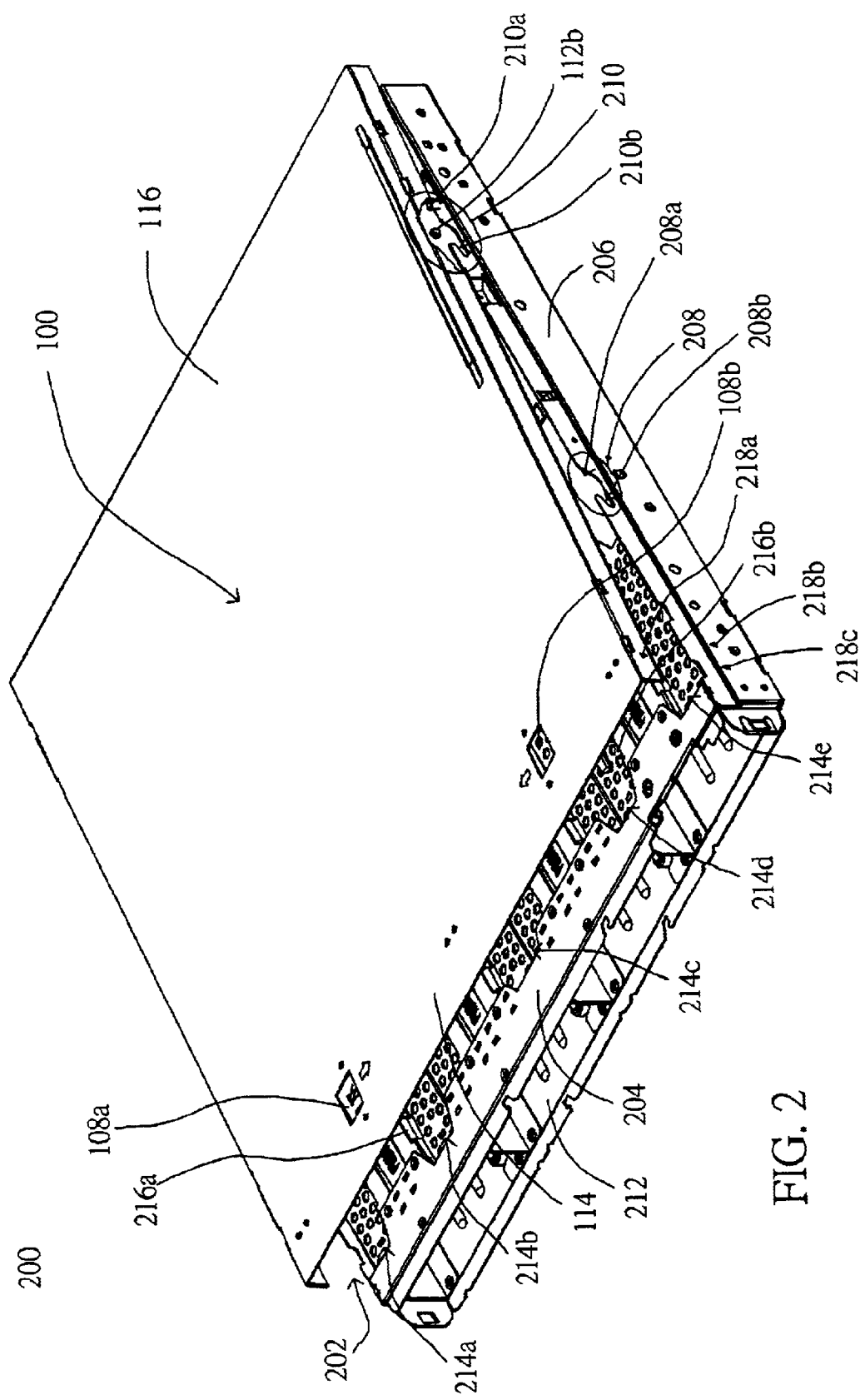
FIG. 2 shows the computer system housing according to a preferred embodiment of the invention.

The computer system housing 200 according to a preferred embodiment of the invention, applied in a personal computer or a server, includes at least two major parts: a top cover 100, and a base frame 202 assembled with the top cover 100, as shown in FIG. 2.

Figure 1:
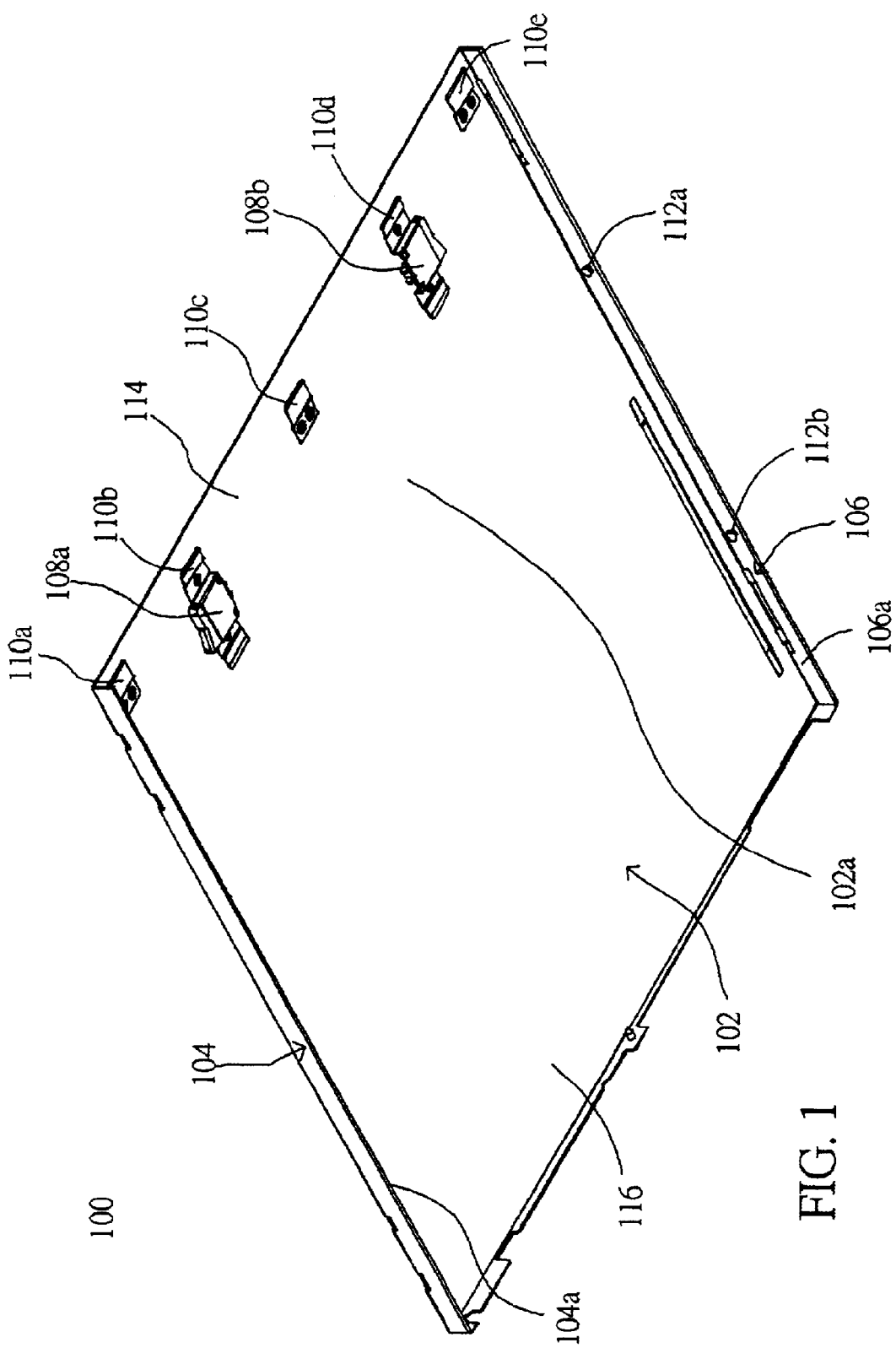
FIG. 1 is the bottom view of the top cover according to a preferred embodiment of the invention.

FIG. 1 is the bottom view of the top cover 100. The top cover 100 is constructed by a top piece 102, the first side 104 and the second side 106. The first side 104 and the second side 106 are approximately parallel and connected two opposite sides of the top piece 102. The interior of each of the top piece 102, the first side 104 and the second side 106 is numbered as 102a, 104a and 106a, respectively. As shown in FIG. 1, the top cover 100 further comprises: two latches 108a, 108b, five tabs 110a, 110b, 110c, 110d, 110e, two first prominences (not shown), and two second prominences 112a, 112b. The number of the latch, tab and prominence mentioned above is only taken as an example. It is to be understood that the number of those devices is not limited thereto. The two latches 108a, 108b on the interior 102a of the top piece 102 are approximately parallel and positioned near the front end 114 of the top cover 100. The five tabs 110a, 110b, 110c, 110d, 110e on the interior 102a of the top piece 102 are approximately parallel and also positioned near the front end 114 of the top cover 100. As shown in FIG. 1, two of the five tabs, the tabs 110b and the tabs 110d, are adjacent and connected to the two latches 108a and 108b. Preferably, tabs 110a, 110b, 110c, 110d, 110e are flat pieces which project from the interior 102a of the top piece 102 of the top cover 100 downwardly and then extend toward the front end 114 of the top cover 100. The first prominences are defined on the interior 104a of the first side 104 and the second prominences 112a and 112b are defined on the interior 106a of the second side 106.

Then, referring to FIG. 2, the top cover 100 and the base frame 202 of the server housing 200 according to a preferred embodiment of the invention are shown. The base frame 202 comprises the first side panel (not shown), the second side panel 206 and the mounting bracket 204. The first side panel (not shown) and the second side panel 206 are approximately parallel and connected two opposite sides of the base frame 202. The first side panel comprises two first guiding recesses for receiving the first prominences. The second side panel 206 comprises two second guiding recesses 208 and 210 for receiving the second prominences 112a, 112b. Each of the first guiding recesses and the second guiding recesses 208, 210 is hollow L-shaped and extends toward the front end 212 of the base frame 202, viewing from the inside of the base frame 202. And each of the first guiding recesses and the second guiding recesses 208, 210 comprises a vertical cut and a horizon cut. For example, the second guiding recess 208 comprises a vertical cut 208a and a horizon cut 208b. The mounting bracket 204 mounted in the base frame 202 further comprises five recesses 214a, 214b, 214c, 214d and 214e for receiving five respective tabs 110a, 110b, 110c, 110d and 110e and two for receiving respective latches 108a and 108b.

The top cover 100 further comprises the first positing mark 218a at the exterior of the two sides of the top cover 100 near the front end 114. The base frame 202 comprises the second positioning mark 218b and the third positioning mark 218c at the exterior of each of the first side panel and the second side panel 206. The distance between the second positioning mark 218b and the third positioning mark 218c is substantially the same as the width of the horizon cut 208b.

Figure 3:
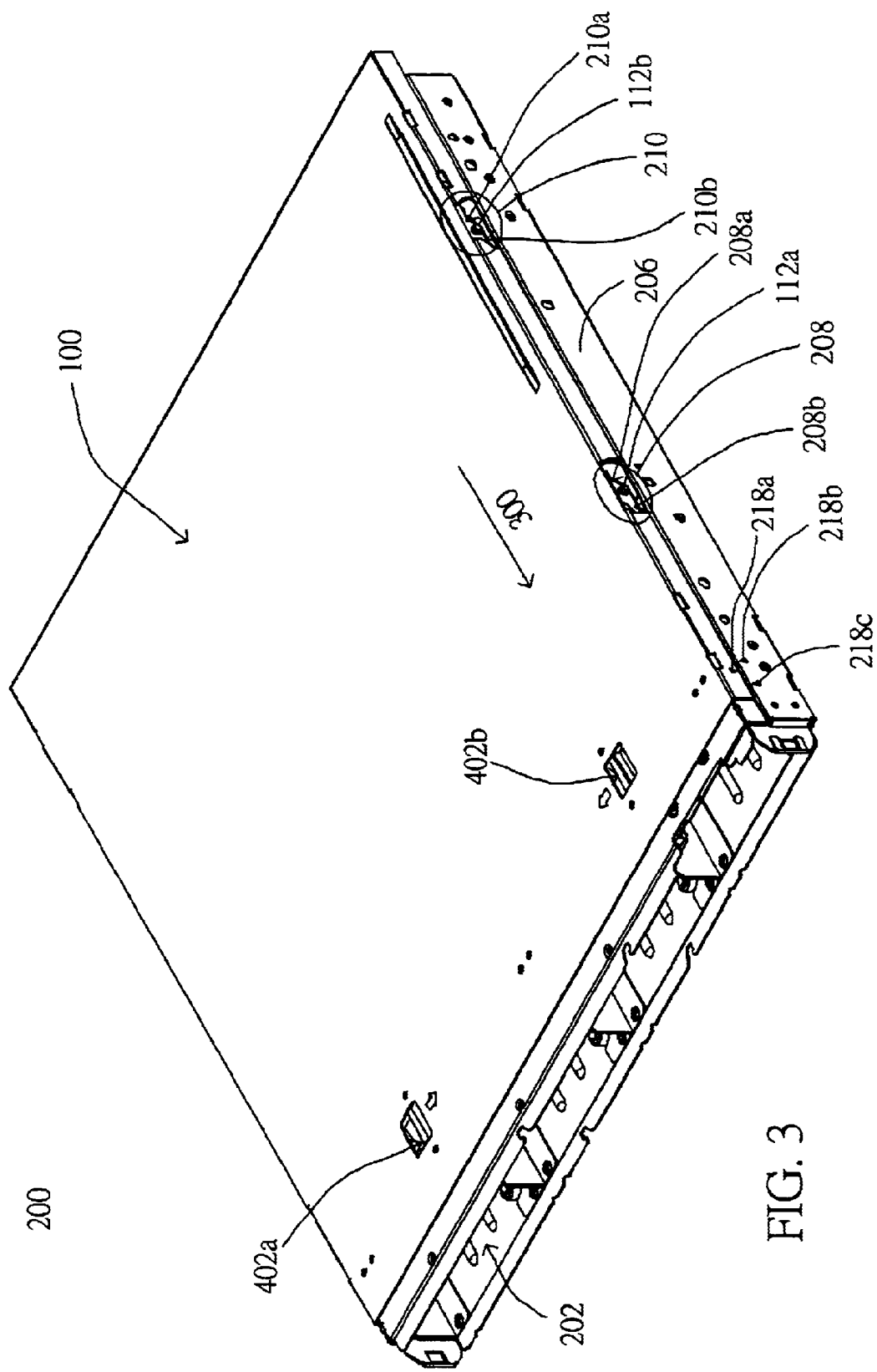
FIG. 3 and FIG. 4 show the process of assembling the top cover and the base frame according to a preferred embodiment of the invention.
Figure 4:
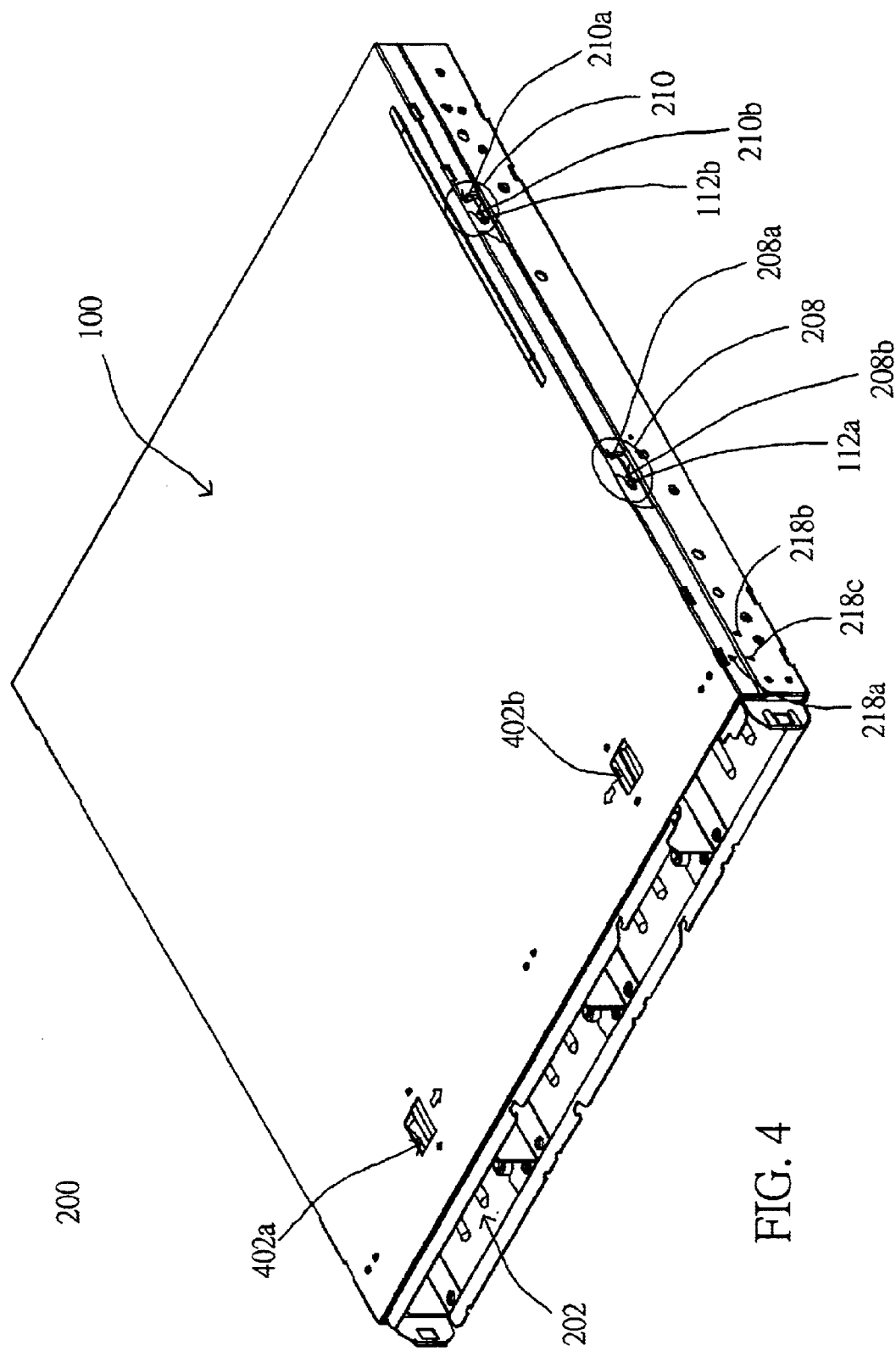

FIG. 3 and FIG. 4 show the process of assembling the top cover and the base frame according to a preferred embodiment of the invention. As shown in FIG. 3, while the first prominences (not shown) and the second prominences 112a, 112b are inserted into the associated vertical cuts, such as vertical cuts 208a, 210a, of the first guiding recesses (not shown) and the second guiding recesses 208, 210, the first positioning mark 218a aligns with the second positioning mark 218b. The top cover 100 is then pushed forward along the arrow 300 to reach the state as shown in FIG. 4. While the first prominences (not shown) and the second prominences 112a, 112b reach the end of the horizon cuts 208b of the first guiding recesses (not shown) and the second guiding recesses 208, 210, the first positioning mark 218a aligns with the third positioning mark 218c.

Figure 5:
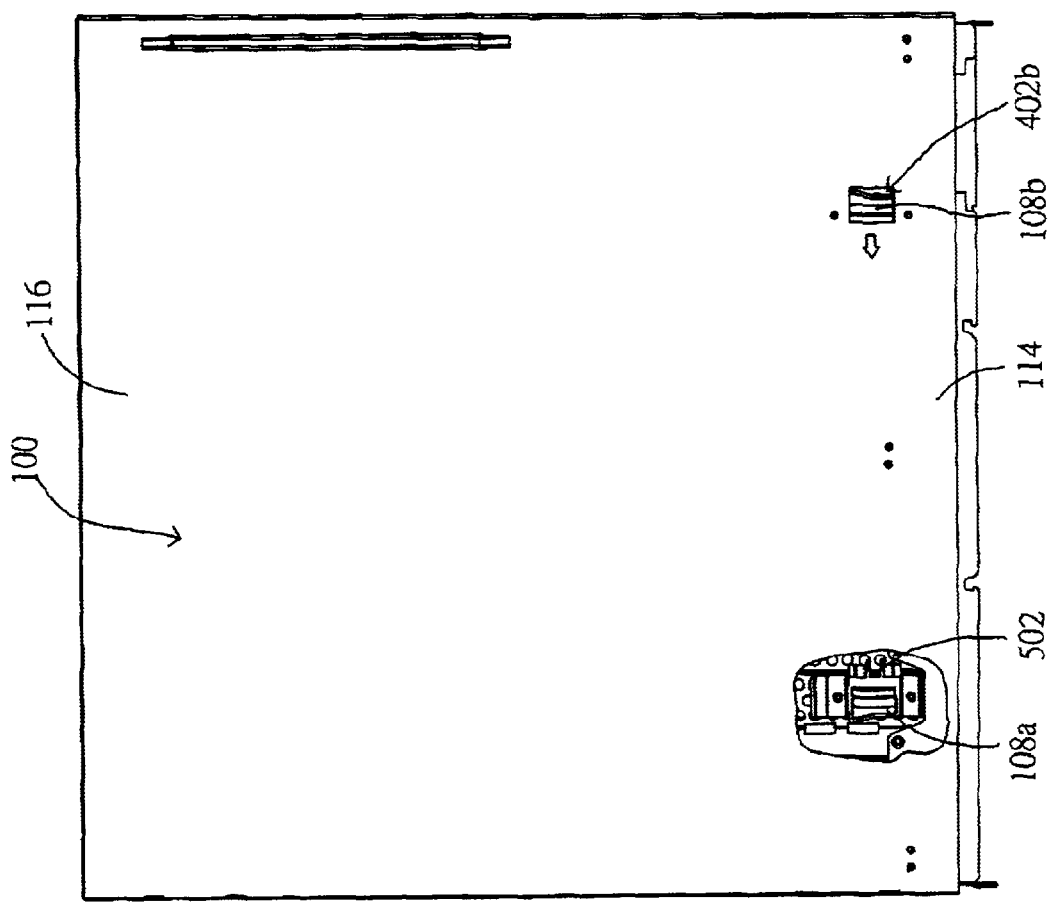
FIG. 5 and FIG. 6 show the perspective view of the latch, controlled by springs.
Figure 6:
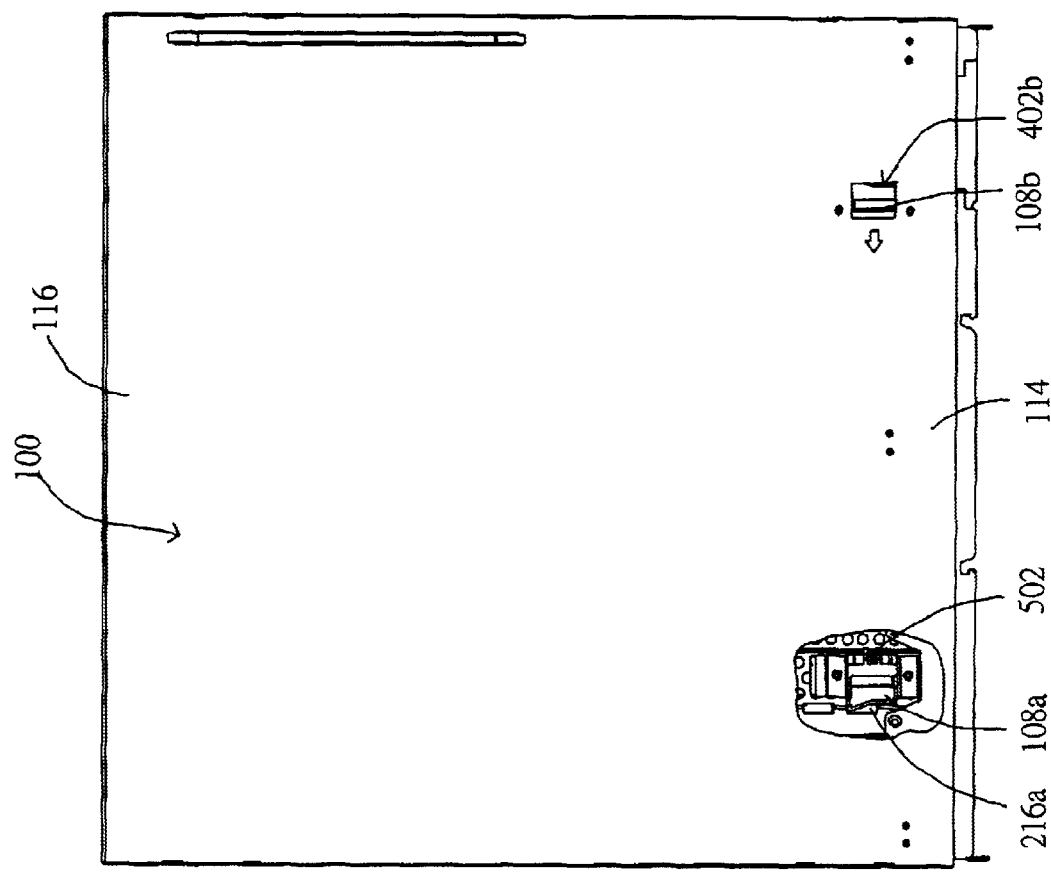

The top cover 100 can be locked on and unlocked from the base frame 202 by the operation of the latches 108a, 108b. Two opening 402a and 402b are defined on the top cover 100 to expose the latches 108a and 108b, respectively. As shown in FIG. 5 and FIG. 6, the latch 108a is controlled by a spring 502 and the latch 108b is controlled by another spring (not shown). Taking the latch 108a as an example, while the top cover 100 is moved from the rear end 116 to the front end 114 to assemble with the base frame 202, the latch 108a is compresses, as shown in FIG. 5. While the top cover 100 assembles with the base frame 202, as shown in FIG. 6, the latch 108a springs outward and engages in the associated notch 216a so that the top cover 100 is assembled and locked on the base frame 202. The assembled and locked top cover 100 and the base frame 202 can be unlocked by pushing the latches 108a and 108b away from the notches 216a and 216b through the openings 402a and 402b.

The advantages of the top cover of the server housing include at least the following:

1. Firm attachment of the top cover and the base frame by the aid of the tabs, latches and prominences;
2. Quick and easy installation and removal of the top cover;
3. Simple positioning with the aid of the positioning marks; and
4. allowing a user to open and close the case without the use of special tools or screws.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A computer system housing, comprising:
    a top cover with an top piece and parallel first side and second side, wherein the two parallel sides are coupled with two opposite sides of the top piece and each of the top piece and the two parallel sides has an interior, and wherein the top cover further comprises:
        a plurality of approximately parallel latches on the interior of the top piece;
        a plurality of approximately parallel tabs on the interior of the top piece;
        a plurality of first prominences on the interior of the first side; and
        a plurality of second prominences on the interior of the second side; and
    a base frame assembled with the top cover, wherein the base frame comprises:
        a first side panel, comprising a plurality of first guiding recesses for receiving the first prominences;
        a second side panel parallel to the first side panel, comprising a plurality of second guiding recesses for receiving the second prominences; and
        a mounting bracket, wherein the mounting bracket comprises
            a plurality of recesses for receiving the tabs; and
            a plurality of notches for receiving the latches.

2. The computer system housing as claimed in claim 1, wherein the top cover comprises a front end and a rear end, and the tabs are flat pieces which project from the interior of the top piece of the top cover downwardly and then extend toward the front end of the top cover.

3. The computer system housing as claimed in claim 1, wherein each of the latches is controlled by a spring.

4. The computer system housing as claimed in claim 3, wherein each of the latches is compressed, while the top cover is moved from the rear end to the front end to assemble with the base frame.

5. The computer system housing as claimed in claim 4, wherein each of the latches springs outward and engages in each associated notch while the top cover assembles with the base frame.

6. The computer system housing as claimed in claim 3, wherein a plurality of openings are defined on the top cover to expose each of the latches.

7. The computer system housing as claimed in claim 6, wherein the assembled and locked top cover and the base frame can be unlocked by pushing the latches away from the notches through the openings.

8. The computer system housing as claimed in claim 1, wherein the first guiding recesses are L-shaped which extend toward the front end of the base frame, viewing from the inside of the base frame.

9. The computer system housing as claimed in claim 8, wherein each of the first guiding recesses comprises a vertical cut and a horizon cut.

10. The computer system housing as claimed in claim 9, wherein an exterior of each side of the top cover comprises a first positioning mark, and an exterior of the first side panel of the base frame comprises a second positioning mark and a third positioning mark, and wherein the first positioning mark aligns with the second positioning mark while the first prominences are inserted into the vertical cuts of the first guiding recesses and the first positioning mark aligns with the third positioning mark while the first prominences reach the end of the horizon cuts of the first guiding recesses.

11. The computer system housing as claimed in claim 1, wherein the second guiding recesses are L-shaped which extend toward the front end of the base frame, viewing from the inside of the base frame.

12. The computer system housing as claimed in claim 11, wherein each of second first guiding recesses comprises a vertical cut and a horizon cut.

13. The computer system housing as claimed in claim 12, wherein an exterior of each side of the top cover comprises a first positioning mark, and an exterior of the first side panel of the base frame comprises a second positioning mark and a third positioning mark, and wherein the first positioning mark aligns with the second positioning mark while the first prominences are inserted into the vertical cuts of the first guiding recesses and the first positioning mark aligns with the third positioning mark while the first prominences reach the end of the horizon cuts of the first guiding recesses.

14. The computer system housing as claimed in claim 1, wherein the top cover comprises two latches and the base frame comprises two notches.

15. The computer system housing as claimed in claim 14, wherein the top cover comprises five tabs and the base frame comprises five recesses for receiving the five tabs.

16. The computer system housing as claimed in claim 15, wherein two of the tabs are adjacent to the two latches.

17. The computer system housing as claimed in claim 1, wherein the top cover comprises two first prominences and two second prominences and the base frame comprises two first guiding recesses for receiving the first prominences and two second guiding recesses for receiving the second prominences.

18. The computer system housing as claimed in claim 1 is applied in a server.

19. A server housing, comprising:
   a top cover with an top piece and parallel first side and second side, wherein the two parallel sides are coupled with two opposite sides of the top piece and each of the top piece and the two parallel sides has an interior, and wherein the top cover further comprises:
      two approximately parallel latches on the interior of the top piece;
      five approximately parallel tabs on the interior of the top piece;
      two first prominences on the interior of the first side; and
      two second prominences on the interior of the second side; and
   a base frame assembled with the top cover, wherein the base frame comprises:
      a first side panel, comprising two first guiding recesses for receiving the first prominences;
      a second side panel parallel to the first side panel, comprising two second guiding recesses for receiving the second prominences; and
      a mounting bracket, wherein the mounting bracket comprises:
         five recesses for receiving the tabs; and
         two notches for receiving the latches.

20. A top cover of a server housing, having an top piece and parallel first side and second side, wherein the two parallel sides are coupled with two opposite sides of the top piece and each of the top piece and the two parallel sides has an interior, and wherein the top cover further comprises:
   two approximately parallel latches on the interior of the top piece;
   five approximately parallel tabs on the interior of the top piece;
   two first prominences on the interior of the first side; and
   two second prominences on the interior of the second side.

\* \* \* \* \*